United States Patent [19]
Vanden Heuvel et al.

[11] 3,827,004
[45] July 30, 1974

[54] CIRCUIT BOARD PIN

[75] Inventors: Milike Vanden Heuvel; Will Thelissen, both of S-Hertogenbosch, Netherlands

[73] Assignee: E. I. duPont de Nemours and Company, Wilmington, Del.

[22] Filed: Jan. 18, 1973

[21] Appl. No.: 324,755

[30] Foreign Application Priority Data

May 10, 1972 Netherlands....................7206313

[52] U.S. Cl................ 339/221 R, 85/19, 339/17 R, 339/275 B, 174/68.5
[51] Int. Cl......................................... H05k 1/04
[58] Field of Search........... 339/17, 18, 19, 95, 125, 339/126, 128, 217, 221, 252, 220; 85/19; 151/41.73; 174/68.5

[56] References Cited

UNITED STATES PATENTS

| | | | |
|---|---|---|---|
| 1,989,018 | 1/1935 | Norwood | 85/19 X |
| 2,019,049 | 10/1935 | Hoke | 151/41.73 X |
| 2,194,458 | 3/1940 | Eckler | 85/19 |
| 2,820,209 | 1/1958 | Whitted | 85/19 X |
| 3,134,085 | 5/1964 | Miller et al. | 339/221 R |
| 3,240,100 | 3/1966 | Rose | 85/19 |
| 3,545,080 | 12/1970 | Evans | 339/17 C |

OTHER PUBLICATIONS

"Electrical Manufacturing," April 1959, p. 176, Article & Picture – Flutes Lock Plastic Parts Against Shock and Vibration.

*Primary Examiner*—Bobby R. Gay
*Assistant Examiner*—Terrell P. Lewis
*Attorney, Agent, or Firm*—Thomas Hooker

[57] ABSTRACT

A pin for mounting in a hole in a circuit board without injuring plating in the hole or connections between such plating and multi-layer circuitry in the board. The pin includes pairs of collapsible fins which are bent toward each other when inserted into the hole.

6 Claims, 8 Drawing Figures

CIRCUIT BOARD PIN

The invention relates to circuit board pins adapted to be mounted in plated holes in a circuit board so that the pin is securely held therein prior to soldering. The pin includes two opposed pairs of longitudinally extending collapsible fins projecting outwardly of the periphery of the pin. When the pin is seated in the hole the fins of each pair engage the sides of the hole and collapse toward each other thereby securing the pin in the hole. Because of the collapsible nature of the fins the conductive plating in the hole is not injured and connections between the plating and multi-layer circuitry are preserved. The fins prevent twisting of the pin in the holes during insertion and prior to soldering.

The invention represents an improvement over the circuit board pins of the type disclosed in U.S. Pat. Nos. 2,994,057 and 3,223,960. These patents disclose conventional pins with rigid fins unsuited for mounting in plated circuit board holes. The U.S. Pat. No. 3,444,617 discloses another conventional circuit board pin in which the pin rotates as it is pushed into the circuit board hole.

Other objects and features of the invention will become apparent as the description proceeds, especially when taken in conjunction with the accompanying drawings illustrating the invention of which there is one sheet.

Figures 1, 2, 3, 4, 5, 6, 7, 8:
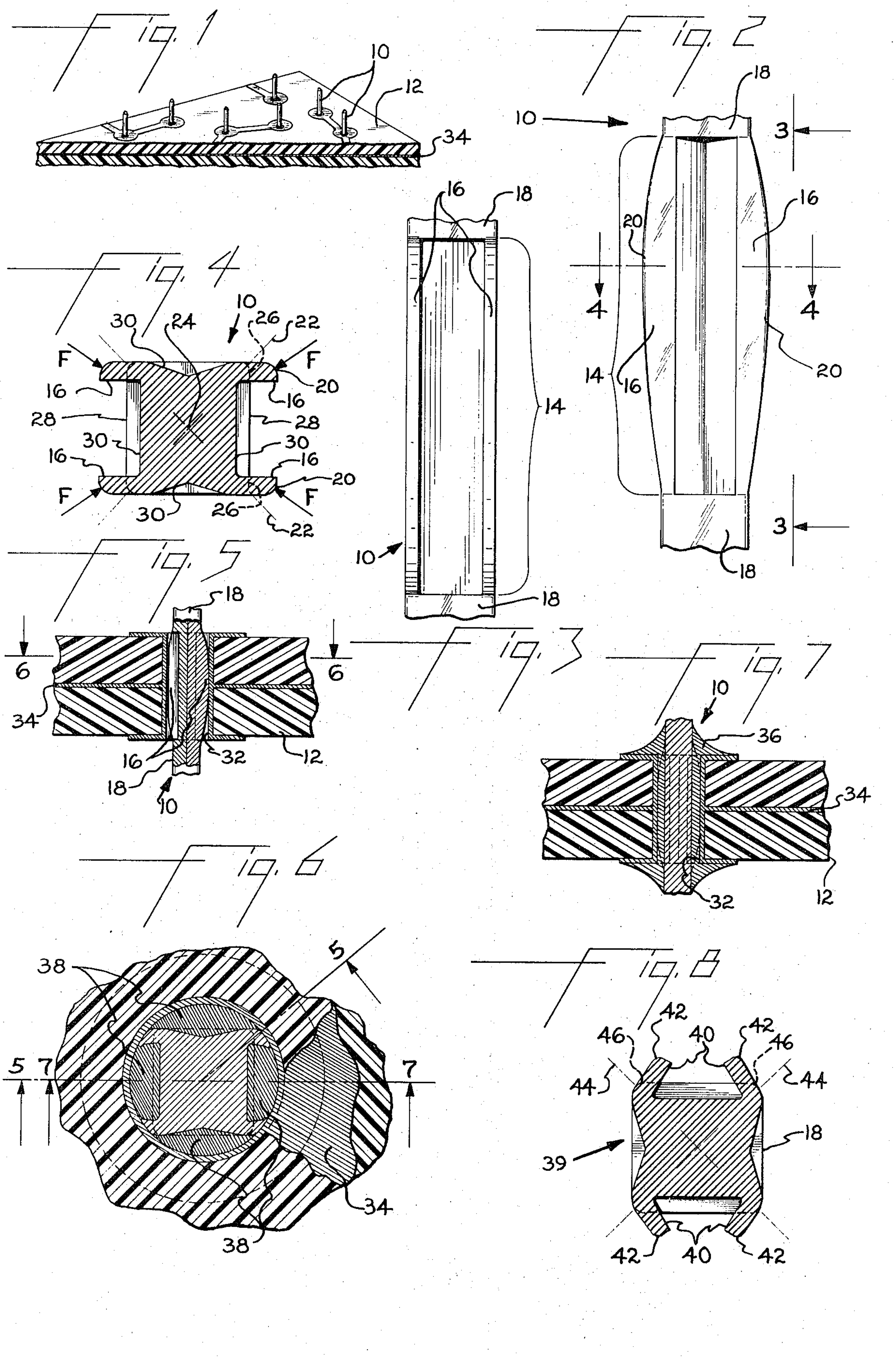
FIG. 1 is a perspective view of a multi-layer circuit board with a number of pins according to the invention mounted thereon.
FIG. 2 is a side view of the hole-engaging portion of the pin.
FIG. 3 is a view taken along line 3—3 of FIG. 2.
FIG. 4 is a sectional view taken along line 4—4 of FIG. 2.
FIG. 5 is a sectional view taken along line 5—5 of FIG. 6 showing a pin mounted in a plated through circuit board hole of a multi-layer circuit board.
FIG. 6 is a partially broken away sectional view taken along line 6—6 of FIG. 5 after solder dipping.
FIG. 7 is a sectional view taken along line 7—7 of FIG. 6.
FIG. 8 is a sectional view of another embodiment of the invention similar to the section of FIG. 4.

Pin 10 is adapted to be mounted in a hole extending into or through the thickness of a circuit board 12 or similar circuit panel. The pin is generally square in cross section and includes a mounting portion 14 provided with two pairs of adjacent fins 16 projecting outwardly of the periphery of the pin and extending longitudinally along the axis of the pin. Pin sections 18 to either end of portion 14 are square in cross section.

Each fin 16 extends outwardly from one corner of the pin 10. A rounded hole-engaging surface 20 is located on the edge of the fin away from the pin. The surfaces 20 of each pair of fins are located between the axial planes 22 passing through the longitudinal axis 24 of the pin and the pin corners 26 from which the fins extend. Fins 16 extend perpendicularly outwardly of opposed opposite pin side walls 28 so that the cross section of the mounting portion 14 is generally H-shaped as illustrated in FIG. 4 with the fins forming the legs of the H.

The hole engaging surfaces 20 of fins 16 are located to one side of the planes 22 so that when portion 14 is moved into a circuit board hole and the surfaces 20 engage the sides of the hole, the radial inward forces F exerted on each fin bends the fin toward one pin side 28. If the fins extended radially outwardly of the pin along an axial plane the force exerted upon them during insertion into a circuit board hole would not collapse the fins with the result that the fin would dig into the hole and it would injure the plating. Location of the hole-engaging surfaces 20 to one side of the axial planes 22 assures that during insertion the fins are bent and do not injure the plating.

The mounting portion 14 may be formed by a stamping operation. Longitudinal recesses 30 are stamp formed in a portion of a square pin whereby the fins 16 are forced or extruded outwardly of the periphery of the pin. This operation work hardens the fins to provide an improved spring property. As shown in FIG. 2 the fins 16 are gradually tapered outwardly of the periphery of the square pin portions 18 in order to facilitate moving portion 14 into a circuit board hole.

Portions 18 of the pin 10 extend freely into plated circuit board hole 32 extending through the thickness of multi-layer circuit board 12. The hole-engaging surfaces 20 of fins 16, however, have a greater radius from axis 24 than the radius of hole 32. The pin 10 is positioned in the hole 32 by freely moving one portion 18 therethrough and then inserting portion 14 in the hole. As the portion 14 is moved into the hole, surfaces 20 are brought into engagement with the plating in the hole. With further insertion of the pin each fin 16 is bent toward the adjacent fin. The work hardened fins are thus collapsed toward each other so that the pin is securely held in the hole 32. The collapsible fins permit mounting pin 10 in circuit board holes of different diameter. This feature is important because it is difficult to assure that a number of circuit board holes are of the same diameter.

Insertion of pins 10 with collapsible fins does not injure the plating in the holes 32. Thus the pins 10 are inserted into the holes in the circuit board 12 without impairing the electrical connections in the plated hole. This is particularly important in the case of circuit boards having internal conductive layers 34 with electrical connections formed between the layers 34 and plating in the circuit board holes. The insertion of conventional press fit type pins into plated holes may rupture the plating and injure the electrical connections between the internal circuitry 34 and the plating in the hole.

The pin is not rotated during insertion because the fins in each pair of fins collapse toward each other. The pin 10 may be picked up by insertion tooling in a given angular orientation and then mounted on a circuit board in the same orientation to assure that the flat surfaces of sections 18 are properly aligned as required by the usage of board 12 when completely assembled. As an example the angular orientation of the pins is important in the case disconnect terminals are attached.

FIG. 5 illustrates a pin 10 which has been seated in the plated hole 32 through circuit board 12. Fins 16 have been partially collapsed and engage the sides of the plated hole. After the pin 10 is seated in the board the connection is soldered, either by hand or by a conventional type soldering method, in order to provide an electrical connection 36 between the pin and plated circuitry on board 12. Molten solder is applied to the pin at one side of the circuit board and flows along the four solder flow channels 38 to the other side of the board. Recesses 30 contribute to channels 38 and improve the solder flow through the circuit board hole 32.

FIG. 8 illustrates a modified pin 39 in which adjacent fins 40 are bent toward each other. This provides a somewhat more resilient connection between the pin and the circuit board hole by moving the hole-engaging surfaces 42 further away from the axial planes 44 passing through corners 46 than in the case of the pin 10 in which the fins 16 extend perpendicularly outwardly of the pin side walls 28. With the exception of the bent fins 42 pin 39 is identical to pin 10.

While the pins 10 and 38 disclosed herein are both square in cross section it is obvious that the invention may be used with cylindrical pins or pins having other cross sections in which it is desired to mount the pins in circuit board holes. The invention is particularly useful in connection with mounting circuit board pins in plated circuit board holes, however it may be used in connection with mounting pins in circuit board holes which are not plated. In some instances a pin may be provided with a single pair of fins in contrast to the two opposed pairs of fins illustrated in connection with a square pin.

While we have described and illustrated preferred embodiments of our invention, it is understood that these are capable of modification, and we therefore do not wish to be limited to the precise details set forth but desire to avail ourselves of such changes and modifications as fall within the purview of the following claims.

What we claim as our invention is:

1. A metal circuit board pin having a longitudinally extending generally square first portion with four parallel corners and flat sides joining said corners, and a second portion located at one end of said first portion adapted to be inserted in a hole in a circuit panel, said second portion including two pairs of longitudinally extending collapsible fins, each fin forming a longitudinal extension of one of said corners and projecting outwardly beyond the periphery of said first portion, said second portion also including a pair of opposed longitudinally extending recesses each positioned between a pair of adjacent fins, said recesses being located inwardly of the periphery of said first portion, each fin including a circuit panel-engaging edge with the edges of each pair of fins located between planes passing through the longitudinal axis of the pin and the corners from which such fins extend.

2. A circuit pin as in claim 1 wherein at one end of said second portion the height of the fins outwardly of the pin is gradually decreased to provide a tapered lead-in to facilitate insertion of the portion within a hole in a circuit panel.

3. A circuit pin as in claim 2 wherein each of said fins extends perpendicularly away from one side of the first portion.

4. A circuit pin as in claim 2 wherein the fins of each pair of fins extend toward each other so that the distance between said edges of each pair of fins is less than the distance between said corners.

5. A square metal circuit pin for mounting in a hole in a circuit panel including a hole-engaging portion of generally H-shaped cross section as taken in a plane perpendicular to the longitudinal pin axis, the legs at each end of the H defined by a pair of longitudinally extending collapsible fins whereby upon insertion of the pin into a circuit panel the fins at each end of the H are collapsed toward each other.

6. A circuit board pin as in claim 5 wherein the legs at each end of the H are flat and generally parallel to each other.

* * * * *